(12) United States Patent
Lin

(10) Patent No.: US 6,635,902 B1
(45) Date of Patent: Oct. 21, 2003

(54) SERIAL CONNECTION STRUCTURE OF LIGHT EMITTING DIODE CHIP

(75) Inventor: Ming-Te Lin, Taipei Hsien (TW)

(73) Assignee: Para Light Electronics Co., Ltd., Taipei (TW)

( * ) Notice: Subject to any disclaimer, the term of this patent is extended or adjusted under 35 U.S.C. 154(b) by 0 days.

(21) Appl. No.: 10/153,647

(22) Filed: May 24, 2002

(51) Int. Cl.[7] .......................... H01L 29/78; H01L 33/00
(52) U.S. Cl. .............................................. 257/88
(58) Field of Search ........................................ 257/88

(56) References Cited

U.S. PATENT DOCUMENTS

| 4,298,869 A | * | 11/1981 | Okuno |
| 5,101,246 A | * | 3/1992 | Onodera |
| 5,278,432 A | * | 1/1994 | Ignatius et al. |

* cited by examiner

Primary Examiner—Stephen D. Meier
(74) Attorney, Agent, or Firm—Bacon & Thomas, PLLC

(57) ABSTRACT

A light emitting diode (LED) device includes a substrate having a major surface on which a number of LED chips are formed and arranged in a two-dimensional array. The LED chips have a p-type semiconductor and an n-type semiconductor. The n-type semiconductor of each LED chip is electrically connected to the p-type semiconductor of the adjacent LED chip, whereby the LED chips are connected in series. The p-type semiconductor of the starting LED chip and the n-type semiconductor of the ending LED chip are connected to conductors for electrical connection with an external power source. The arrangement of serially connected LED chips allows enhancement of the brightness of a single LED device when the size of the LED device is increased. The working voltage is also increased and the working current can be kept low. Interfacing equipment between the LED device and external power source can be simplified.

10 Claims, 3 Drawing Sheets

SERIAL CONNECTION STRUCTURE OF LIGHT EMITTING DIODE CHIP

FIELD OF THE INVENTION

The present invention generally relates to light emitting diodes (LEDs), and in particular to a single LED chip comprising a number of LED cells connected in series for enhancing brightness and increasing the overall operation voltage to match with the electrical potential of the electric main.

BACKGROUND OF THE INVENTION.

Brightness is one of the major concerns of light emitting diode (LED) devices. The most commonly employed method in enhancing the brightness of the LED devices is to increase the chip size of an LED chip. In the industry, the LED chip size has been increased from 9 mil×9 mil to 25 mil×25 mil to the recently developed 40 mil×40 mil. The working current for the LED chip has increased from 20 mA to 50 mA and has reached 500 mA recently. Such a working current leads to an overall voltage drop of around 2–4 volts for direct current which is much lower than the regular voltage supplied by the electric main which is 110–220 V in general. Thus, expenses for power transformation and regulation, as well as related equipments, are very high.

FIGS. 7 and 8 show a conventional circuit arrangement for LED devices in which the LED cells are connected in parallel. Such an arrangement increases the overall current consumption while requiring only a small voltage drop. Thus, the difference in voltage between the LED device and the electric main is significant.

It is thus desired to provide a serial arrangement of LED cells in a single LED chip for overcoming the problems discussed above.

SUMMARY OF THE INVENTION

An object of the present invention is to provide a serial connection structure of LED cells inside a single LED chip for increasing the voltage drop and maintaining a low working current.

Another object of the present invention is to provide an LED module that is connectable with an electric main with simplified and thus low-cost interfacing devices.

To achieve the above objects, in accordance with the present invention, there is provided serial connection structure of a light emitting diode device. The device comprises a substrate having a major surface on which a number of LED cells are formed and arranged in a two-dimensional array. The LED cells have a p-type semiconductor and an n-type semiconductor. The n-type semiconductor of each LED cell is electrically connected to the p-type semiconductor of the adjacent LED cell whereby the LED cells are connected in series. The p-type semiconductor of the starting LED cell and the n-type semiconductor of the ending LED cell are connected to conductors for electrical connection with an external power source. The arrangement of serially connected LED cells allows enhancement of the brightness of a single LED device when the chip size of the LED device is increased. The working voltage is also heightened and the working current can be maintained low. Interfacing equipments between the LED device and external power source can be simplified.

BRIEF DESCRIPTION OF THE DRAWINGS

The present invention will be apparent to those skilled in the art by the following description of preferred embodiments thereof, with reference to ached drawings, in which.

DETAILED DESCRIPTION OF THE PREFERRED EMBODIMENTS

Figure 1:
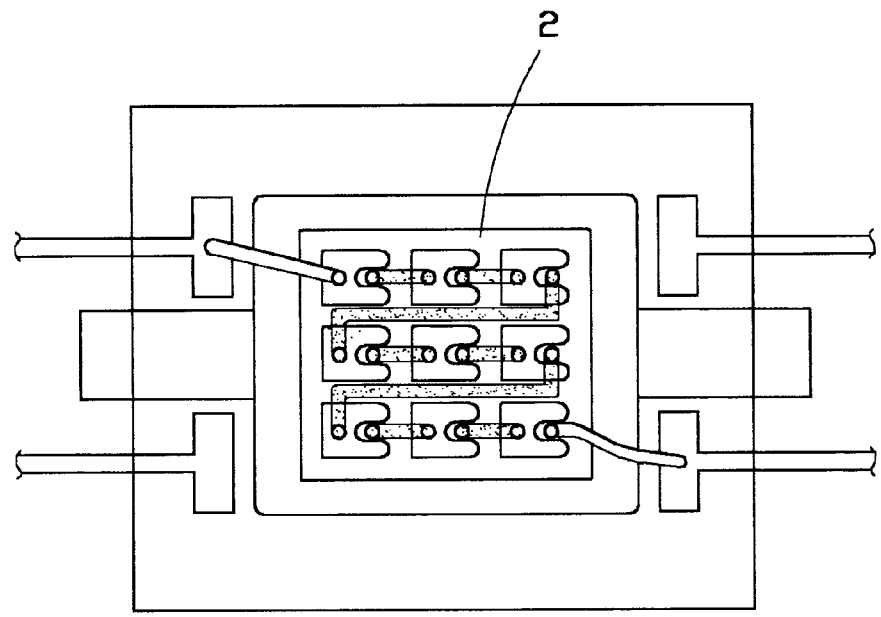
FIG. 1 is a plan view of a packaged light emitting diode (LED) device constructed in accordance with the present invention.
Figure 2:
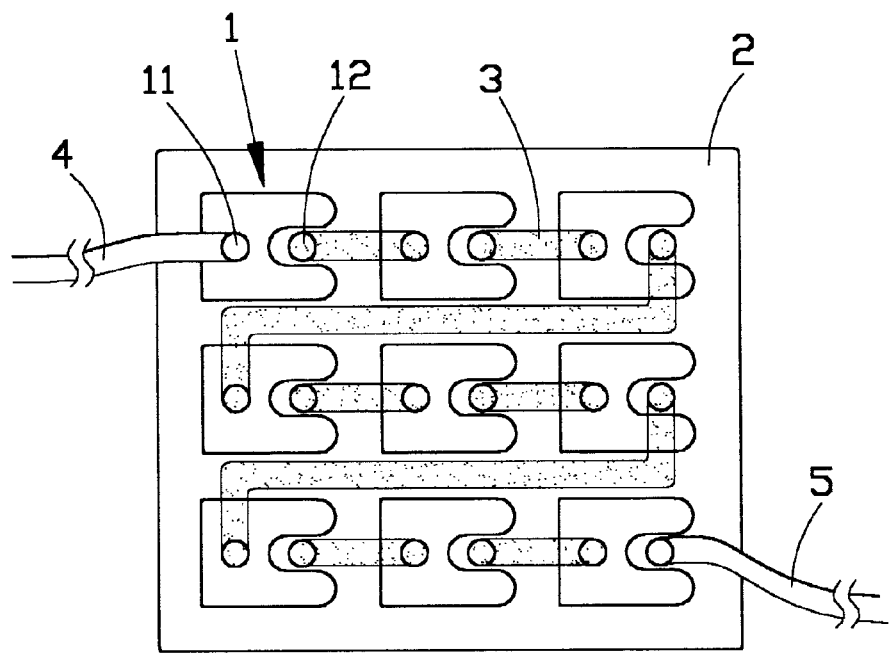
FIG. 2 is a plan view of an LED chip of the LED device of the present invention.
Figure 3:
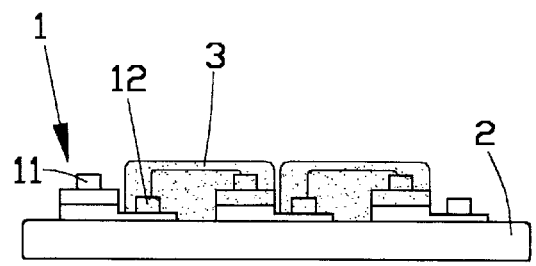
FIG. 3 is a side elevational view of the LED chip of the present invention.
Figures 5, 6:
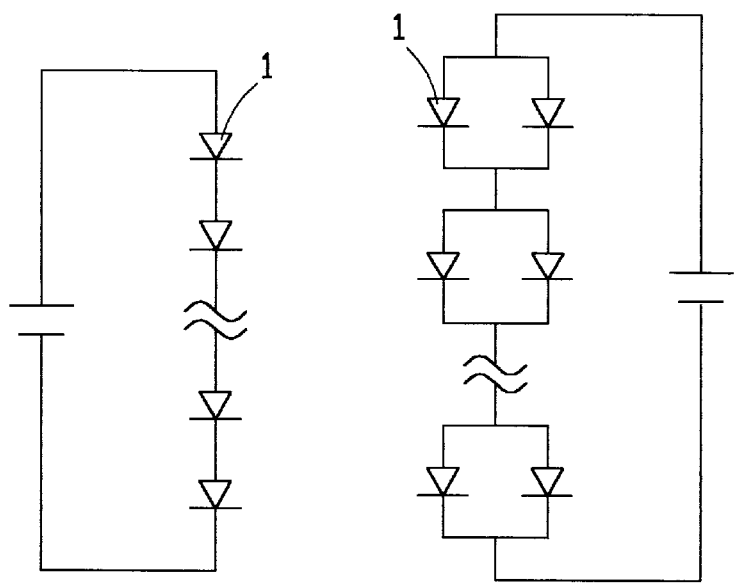
FIG. 5 is a circuit diagram of the serial connection structure of the LED device in accordance with the present invention.
FIG. 6 is another circuit diagram of the serial connection structure of the LED device in accordance with the present invention.
Figure 7:
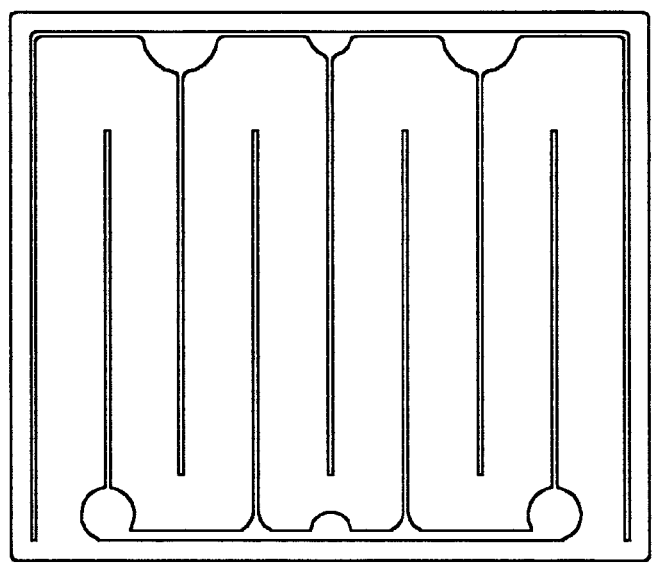
FIG. 7 is a plan view of a conventional LED chip.
Figure 8:
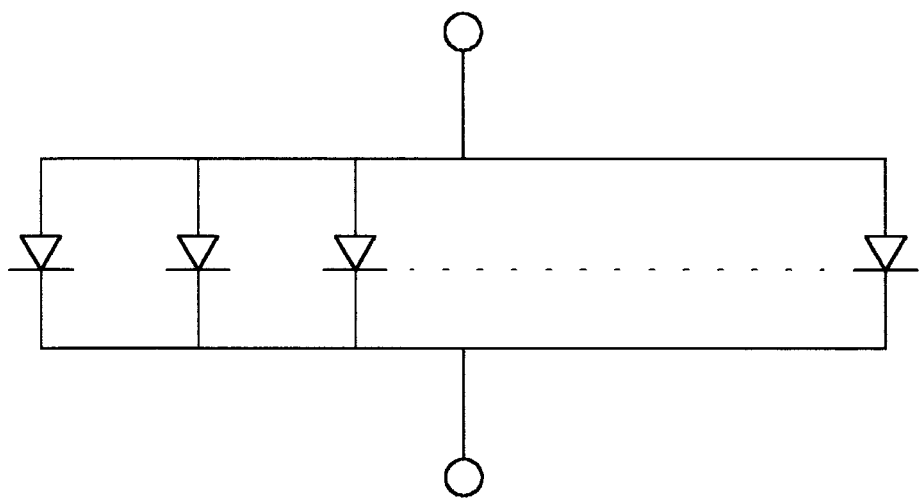
FIG. 8 is a circuit diagram of the convention LED chip.

With reference to the drawings and in particular to FIGS. 1–3, a light emitting diode (LED) device in accordance with the present invention comprises a substrate 2 having a major surface (not labeled) on which a number of LED cells 1 arranged in a two dimensional array are formed. Each LED cell 1 comprises a p-type semiconductor 11 and an n-type semiconductor 12. The substrate 2 is made of insulation material that is either transparent or non-transparent. The p-type semiconductor 12 of each LED cell 1 is electrically connected to the n-type semiconductor 11 of the adjacent LED cell 1 by means of a conductor. 3, except the starting LED cell and the ending LED cell of which the p-type semiconductor 11 and the n-type semiconductor 12, respectively, are connected to conductors 4, 5 for connection with an external power source. Thus, the LED cells 1 of the LED device are connected in series of which a circuit diagram is shown in FIG. 5.

Due to the serial connection of the LED cells 1, a small working current but a large voltage is required for operating the LED device. By suitably arranging the LED cells 1, the working voltage of the LED device may be 10 or 100 V with a working current of 10–20 mA. This makes the LED device more suitable for use with the electric main that is currently employed in houses because the same brightness or light characteristics of the LED device can be achieved with different electrical condition from that of the conventional designs. Sophisticated devices for transformation and regulation of the electricity are no longer required.

The conductors 3 can be transparent or non-transparent and can be formed on the substrate 2 by wire-bonding or coating techniques of semiconductor manufacturing. The conductors 4, 5 can be formed in the same way as the conductors 3 or connected to the external power source by means of printed circuit boards.

Figure 4:
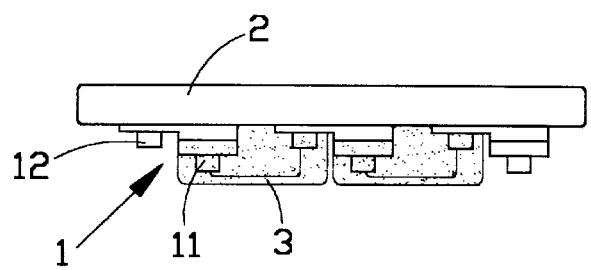
FIG. 4 is a side elevational view of an LED chip in accordance with another embodiment of the present invention.

The LED cells 1 and the conductors 3, 4 5 can be arranged on an opposite surface of the substrate 2 as illustrated in FIG. 4. This can be envisioned by those having ordinary skills. If desired, the LED cells 1 and the conductors 3, 4, 5 can be arranged on both surfaces of the substrate 2.

It can also be envisioned by those having ordinary skills to make different arrangement of the LED cells 1 on the substrate 2. For example, and as shown in FIG. 6, a plurality of LED cells 1 are connected in parallel first to form an "LED group" and a number of "LED groups" are then connected in series.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light emitting diode device for increasing a working voltage of the device while maintaining a low working current without decrease in brightness, comprising:

a substrate having a major surface; and a number of light emitting diode chips mounted on the major surface and arranged in a two-dimensional array, each light emitting diode chip comprising a p-type semiconductor and an n-type semiconductor, the n-type semiconductor of each light emitting diode chip being electrically connected to the p-type semiconductor of an adjacent light emitting diode chip, whereby the light emitting diode chips are connected in series, and wherein said working voltage is between 10 V and 100 V and said working current is between 10 mA and 20 mA.

2. The light emitting diode device as claimed in claim 1, wherein the substrate is made of insulation materials.

3. The light emitting diode device as claimed in claim 1, wherein the substrate is transparent.

4. The light emitting diode device as claimed in claim 1, wherein the substrate is non-transparent.

5. The light emitting diode device as claimed in claim 1, wherein the conductors are formed by coating techniques.

6. The light emitting diode device as claimed in claim 1, wherein the conductors are formed by wire bonding techniques.

7. The light emitting diode device as claimed in claim 1, wherein the conductors are transparent.

8. The light emitting diode device as claimed in claim 1, wherein the conductors are non-transparent.

9. The light emitting diode device as claimed in claim 1 further comprising at least one additional lit emitting diode chip connected in parallel with at least one of the light emitting diode chips that are connected in series.

10. The light emitting diode device as claimed in claim 1 further comprising additional light emitting diode chips connected at least partially in series on an opposite surface of the substrate.

* * * * *